(12) United States Patent
Hamada

(10) Patent No.: US 8,456,563 B2
(45) Date of Patent: Jun. 4, 2013

(54) SOLID-STATE IMAGING DEVICE WITH ON CHIP LENSES WITH ADJUST CHARACTERISTICS TO RENDER PIXEL OUTPUT SENSITIVITIES MORE UNIFORM

(75) Inventor: Kazuhiko Hamada, Nagasaki (JP)

(73) Assignee: Sony Corporation (JP)

( * ) Notice: Subject to any disclaimer, the term of this patent is extended or adjusted under 35 U.S.C. 154(b) by 165 days.

(21) Appl. No.: 12/836,749

(22) Filed: Jul. 15, 2010

(65) Prior Publication Data

US 2011/0019043 A1 Jan. 27, 2011

(30) Foreign Application Priority Data

Jul. 23, 2009 (JP) ................................ 2009-171674

(51) Int. Cl.
*H04N 9/07* (2006.01)
*H04N 5/335* (2011.01)
*H04N 9/04* (2006.01)

(52) U.S. Cl.
USPC ............ 348/336; 348/294; 348/272; 348/273

(58) Field of Classification Search
None
See application file for complete search history.

(56) References Cited

U.S. PATENT DOCUMENTS

| | | | | |
|---|---|---|---|---|
| 7,719,591 B2 * | 5/2010 | Naruse et al. | ................. | 348/308 |
| 7,952,623 B2 * | 5/2011 | Wada | ............................ | 348/273 |
| 2003/0232260 A1* | 12/2003 | Irving et al. | ..................... | 430/21 |
| 2004/0100570 A1* | 5/2004 | Shizukuishi | ................... | 348/272 |
| 2005/0045803 A1* | 3/2005 | Hsu et al. | ..................... | 250/208.1 |
| 2006/0044449 A1* | 3/2006 | Sakoh | ........................... | 348/336 |
| 2006/0066922 A1* | 3/2006 | Nishi | ............................. | 358/482 |
| 2007/0121212 A1* | 5/2007 | Boettiger et al. | ............. | 359/619 |
| 2008/0030803 A1* | 2/2008 | Min et al. | ...................... | 358/483 |
| 2009/0034083 A1* | 2/2009 | Li et al. | .......................... | 359/619 |
| 2011/0176044 A1* | 7/2011 | Toshikiyo | ..................... | 348/302 |

FOREIGN PATENT DOCUMENTS

| | | |
|---|---|---|
| JP | 2002-076322 | 3/2002 |
| JP | 2002-151670 | 5/2002 |
| JP | 2005-116939 | 4/2005 |
| JP | 2006-054276 | 2/2006 |

* cited by examiner

*Primary Examiner* — Lin Ye
*Assistant Examiner* — John H Morehead, III
(74) *Attorney, Agent, or Firm* — Sheridan Ross P.C.

(57) ABSTRACT

A solid-state imaging device includes: an imaging unit wherein a plurality of light sensing units formed in a matrix and a plurality of interconnections are formed among the plurality of light sensing units; a color filter that is disposed over the imaging unit, and delivers colors to the light sensing units in accordance with a predefined rule; and on-chip lenses that are disposed corresponding to the light sensing units on a one-by-one basis over the color filter, and have light-collection characteristics varying in accordance with differences among sensitivities of the light sensing units, where the differences among the sensitivities of the light sensing units are generated, when the same colors are delivered to the light sensing units in accordance with the same rule, owing to the fact that positions of the individual interconnections relative to the light sensing units vary periodically.

8 Claims, 16 Drawing Sheets

SOLID-STATE IMAGING DEVICE WITH ON CHIP LENSES WITH ADJUST CHARACTERISTICS TO RENDER PIXEL OUTPUT SENSITIVITIES MORE UNIFORM

BACKGROUND OF THE INVENTION

1. Field of the Invention

The present invention relates to solid-state imaging devices, and cameras, and more particularly relates to a solid-state imaging device in which positional relations between light sensing units and interconnection layers vary periodically, and a camera equipped with such a solid-state imaging device.

2. Description of the Related Art

In recent years, a CMOS-type solid-state imaging device, to which CMOS (complementary metal oxide semiconductor) technology, which is one of standard technologies for IC manufacturing is applied, has been in widespread use.

Being different from a CCD (charge coupled device)-type solid-state imaging device, a CMOS-type solid-state imaging device does not use high driving voltages, and can be integrated (disposed on-chip) with peripheral circuits, which brings about a great advantage to miniaturization of the solid-state imaging device.

In addition, miniaturization and multiple-pixel structuration of chips are currently desired for CMOS-type solid-state imaging devices. However, the miniaturization of the chips while the size of the pixels remains as it is leads to a decrease in the number of pixels used in a CMOS-type solid-state imaging device, with the result that the resolution of the solid-state imaging device decreases. On the other hand, the multiple-pixel structuration of the chips while the size of the pixels remains as it is leads to large-size chips, with the result that the cost of production increases or the yield of the chips decreases.

Therefore, it is necessary that the size of the pixel is made smaller than it is now to implement miniaturization and multiple-pixel structuration of the chips. If miniaturization of the size of the pixel is achieved, a smaller CMOS-type solid-state imaging device with the same resolution can be provided, or instead the resolution can be improved while the size of the device remains as it is.

When the size of the pixel is reduced, however, a problem occurs in that the amount of light entering each pixel is reduced and the sensitivity characteristic of the light sensing unit of the pixel is deteriorated. There is a method for maintaining the sensitivity characteristic by increasing the conversion efficiency of an output circuit. In this case, however, noise components are also amplified.

Therefore, S/N ratios of video signals output from the CMOS-type solid-state imaging device are deteriorated. In other words, it is generally difficult to maintain the sensitivity characteristic by increasing the photoelectric conversion efficiency when the size of the pixels is reduced, thereby it becomes necessary to improve the light-collection efficiency of each pixel in order to prevent S/N ratios of the video signals from being deteriorated.

From such a viewpoint, some devices, in which light-collection efficiency of a light sensing unit is improved by disposing on-chip lenses (OCLs) on a color filter mounted over the light sensing unit, have been proposed as disclosed, for example, in Japanese Unexamined Patent Application Publication Nos. 2002-76322, 2002-151670, and 2005-116939.

A CMOS sensor includes plural pixels arranged in a matrix, and typically a readout gate, a charge-voltage conversion unit, a reset gate, an amplifier, and the like as well as a light sensing unit are included in the region of each pixel, thereby it has been said that the reduction of the size of the pixel is difficult.

Recently, however, a so-called component-shared-by-plural-pixels structure has been proposed (See, for example, Japanese Unexamined Patent Application Publication No. 2006-54276), where the areas occupied by components other than the light sensing unit in each pixel can be reduced by these components, which were originally mounted on each pixel, being shared by plural pixels. Such a technology has been becoming an important technology for realizing the reduction of the size of pixels used in CMOS-type solid-state imaging devices.

SUMMARY OF THE INVENTION

In some cases, however, positional relations between light sensing units and interconnection layers vary periodically in the pixel patterns for achieving the reduction of the size of the pixel or in the patterns for the component-shared-by-plural-pixels structure. Therefore, because the light sensing units and interconnection layers are not disposed regularly, or in other words, because patterns formed for the light sensing units and the interconnection layers are non-uniform patterns, the sensitivities of individual light sensing units vary periodically, with the result that the deterioration of image quality is induced periodically in image signals output from a solid-state imaging device.

The present invention is achieved with the above-described problems borne in mind, and provides a solid-state imaging device that is capable of providing uniform pixel output signals, and a camera equipped therewith.

According to an embodiment of the present invention, there is provided a solid-state imaging device that includes an imaging unit in which a plurality of light sensing units are formed in a matrix and a plurality of interconnections are formed among the plurality of light sensing units; a color filter that is disposed over the imaging unit, and delivers colors to the light sensing units in accordance with a predefined rule; and on-chip lenses that are disposed corresponding to the light sensing units on a one-by-one basis over the color filter, and have light-collection characteristics varying in accordance with differences among sensitivities of the light sensing units, where the differences among the sensitivities of the light sensing units are generated, when the same colors are delivered to the light sensing units in accordance with the same rule, owing to the fact that positions of the individual interconnections relative to the light sensing units vary periodically.

According to another embodiment of the present invention, there is provided a camera that includes a solid-state imaging device including an imaging unit in which a plurality of light sensing units are formed in a matrix and a plurality of interconnections are formed among the plurality of light sensing units, a color filter that is disposed over the imaging unit, and delivers colors to the light sensing units in accordance with a predefined rule, and on-chip lenses that are disposed corresponding to the light sensing units on a one-by-one basis over the color filter, and have light-collection characteristics varying in accordance with differences among sensitivities of the light sensing units, where the differences among the sensitivities of the light sensing units are generated, when the same colors are delivered to the light sensing units in accordance with the same rule, owing to the fact that positions of the individual interconnections relative to the light sensing units vary periodically; an optical system that leads incident lights to the imaging units; and a signal processing circuit for processing signals output from the solid-state imaging device.

Because the light-collection characteristics of the on-chip lenses vary in accordance with the differences among the sensitivities of the light sensing units, where the differences among the sensitivities of the light sensing units are generated, when the same colors are delivered to the light sensing units in accordance with the same rule, owing to the fact that the positions of the individual interconnections relative to the light sensing units vary periodically, the deterioration of image quality owing to the relations between the individual interconnections and the light sensing units can be suppressed.

The sentence "the same colors are delivered to the light sensing units in accordance with the same rule" means that when two light sensing units are compared with each other, the same colors are delivered to aforesaid two light sensing units, and at the same time, if one light sensing unit adjacent to one of aforesaid two light sensing units and another light sensing unit adjacent to the other of aforesaid two light sensing units are respectively located in the same position relative to the one of aforesaid two light sensing units and relative to the other of aforesaid two light sensing units, the same colors are delivered to them.

In the solid-state imaging device and the camera according to embodiments of the present invention, the deterioration of the image quality periodically owing to the relations between the individual interconnections and the light sensing units can be suppressed, and uniform pixel output signals can be provided.

DESCRIPTION OF THE PREFERRED EMBODIMENTS

An embodiment of the present invention (hereinafter referred to as an embodiment) will be described hereinafter.

The description will be made about the following subjects in the following order.

1. First embodiment
2. Second embodiment
3. Modifications

1. First Embodiment

[Schematic Configuration of Solid-State Imaging Device]

Figure 1:
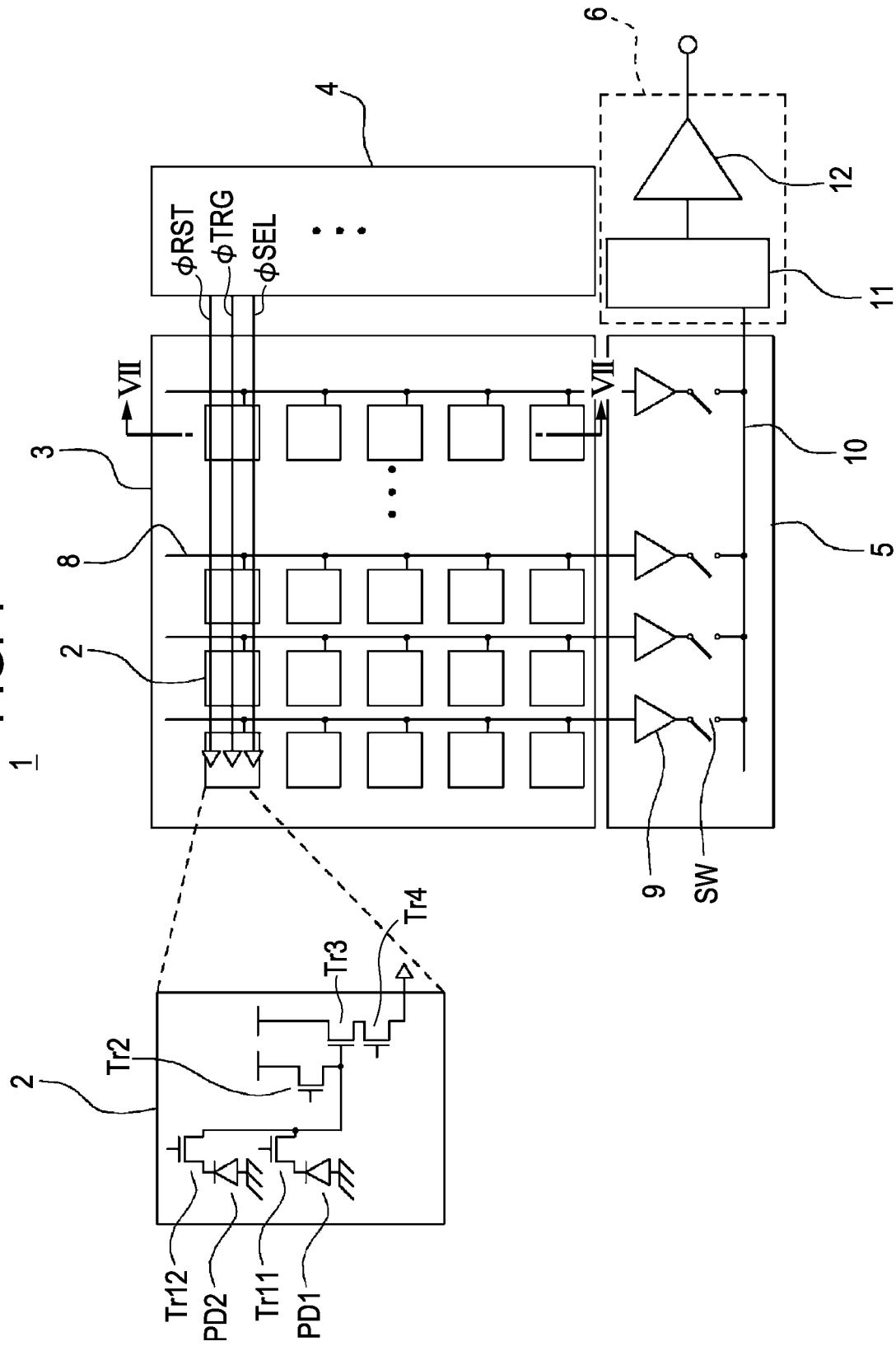
FIG. 1 is a diagram showing a schematic configuration of a CMOS-type image sensor as an example of a solid-state imaging device according to an embodiment of the present invention.

FIG. 1 is a schematic configuration diagram of a CMOS-type image sensor that is an example of a solid-state imaging device according to an embodiment of the present invention. In the CMOS-type image sensor shown in FIG. 1, plural sets of two pixels sharing a reset transistor Tr2, an amplifying transistor Tr3, and a selection transistor Tr4 are arranged in a matrix. A set of two pixels sharing a reset transistor Tr2, an amplifying transistor Tr3, and a selection transistor Tr4 will be referred to as a component-shared-by-two-pixels unit hereinafter.

To put it more precisely, two photodiodes PD1 and PD2, and two transfer transistors Tr11 and Tr12, which correspond to the photodiodes PD1 and PD2 respectively, share the reset transistor Tr2, the amplifying transistor Tr3, and the selection transistor Tr4.

FIG. 1 shows that the CMOS-type image sensor 1 according to a first embodiment is composed of an imaging unit 3 including plural component-shared-by-two-pixels units 2a regularly arranged in a two-dimensional array, and peripheral circuits disposed around the imaging unit 3. The peripheral circuits include a vertical driving unit 4, a horizontal transfer unit 5, and an output unit 6.

The photodiodes PD1 and PD2 perform photoelectric conversion on incident light. In addition, they have charge storage regions in which signal charges obtained by photoelectric conversion are stored.

The transfer transistors TR11 and Tr12 read out the signal charges from the photodiodes PD1 and PD2 respectively and transfer these signal charges to a floating diffusion (FD) region that will be described later.

The reset transistor Tr2 is a transistor for setting the potential of the floating diffusion (FD) region to have a predefined value.

The amplifying transistor Tr3 is a transistor for amplifying the signal charges transferred to the floating diffusion (FD) region.

The selection transistor Tr4 is a transistor for selecting a row of pixels and providing pixel signals corresponding to the row of pixels to a vertical signal line 8.

Although the CMOS-type image sensor 1 according to the first embodiment has been described under the assumption that the CMOS-type image sensor 1 includes the selection transistors Tr4, another CMOS-type image sensor without the selection transistors can be also configured.

In the circuit of the component-shared-by-two-pixels unit 2, as shown in FIG. 1, two photodiodes PD1 and PD2 are connected to the sources of two transfer transistors Tr11 and Tr12 respectively. In addition, both drains of the transfer transistors Tr11 and Tr12 are connected to the source of the reset transistor Tr2.

In addition, the shared floating diffusion (FD) region, which is disposed between the transfer transistors Tr11 and Tr12 and the reset transistor Tr2 as a charge-voltage converter, is connected to the gate of the amplifying transistor Tr3.

Furthermore, the source of the amplifying transistor Tr3 is connected to the drain of the selection transistor Tr4. The drain of the reset transistor Tr2 and the drain of the amplifying transistor Tr3 are connected to the power supply voltage. The source of the selection transistor Tr4 is connected to a vertical signal line 8.

The vertical driving unit 4 supplies the gates of reset transistors of the component-shared-by-two-pixels units 2, which are disposed in a row, with a common reset signal φRST. In addition, the vertical driving unit 4 commonly applies a row transfer signal φTRG to the gates of the transfer transistors Tr11 and Tr12 of the component-shared-by-two-pixels units 2 disposed in a row. Furthermore, the vertical driving unit 4 commonly applies a row transfer signal φSEL to the gates of the selection transistors Tr4 of the component-shared-by-two-pixels units 2 disposed in a row.

The horizontal transfer unit 5 includes analog-to-digital converters 9 (ADCs) that are connected to the vertical signal lines 8 on a one-to-one basis, column selection circuits (switches) SW, and horizontal transfer lines 10 (for example, bus lines in a number equal to the number of data bit lines).

The output unit 6 includes a signal processing circuit 11 for processing output signals provided through the horizontal transfer lines 10 and an output buffer 12.

In the CMOS-type image sensor 1 as an example of a solid-state imaging device according to the embodiment of the present invention, signals read out from component-shared by-two-pixels units 2 belonging to each row are converted into digital signals by the analog-to-digital converters 9, then the digital signals are sequentially selected by the column selection circuits SW, and read out to be sequentially transferred to the horizontal transfer lines 10. The digital signals (image data) are output from the output buffer 12 after being processed by the signal processing circuit 11.

The operation of the component-shared-by-two-pixels unit 2 will be described below. Firstly, charges stored in the photodiodes PD1 and PD2 are completely removed by setting the gates of the transfer transistors Tr11 and Tr12 and the gate of the reset transistor Tr2 to be in an on-state. Secondly, charges are stored in the photodiodes PD1 and PD2 after the gates of the transfer transistors Tr11 and Tr12 and the gate of the reset transistor Tr2 are set to be in an off-state.

Next, just before the charges stored in the photodiodes PD1 and PD2 are read out, the potential of the floating diffusion (FD) region is reset by setting the gate of the reset transistor Tr2 to be in an on-state.

Afterward, the gate of the reset transistor Tr2 is set to be in an off-state, and the gates of the transfer transistors Tr11 and Tr12 are set to be in an on-state, thereby the charges are transferred from the photodiodes PD1 and PD2 to the floating diffusion (FD) region. Next, the signal charges are applied to the gate of the amplifying transistor Tr3 through the photodiodes PD1 and PD2, thereby the amplifying transistor Tr3 amplifies the signal charges.

When the selection transistor Tr4 is set to be in an on-state, image signals obtained through the charge-voltage conversion of the signal charges performed by the amplifying transistor Tr3 are read out through the vertical signal line 8.

Figure 2A:
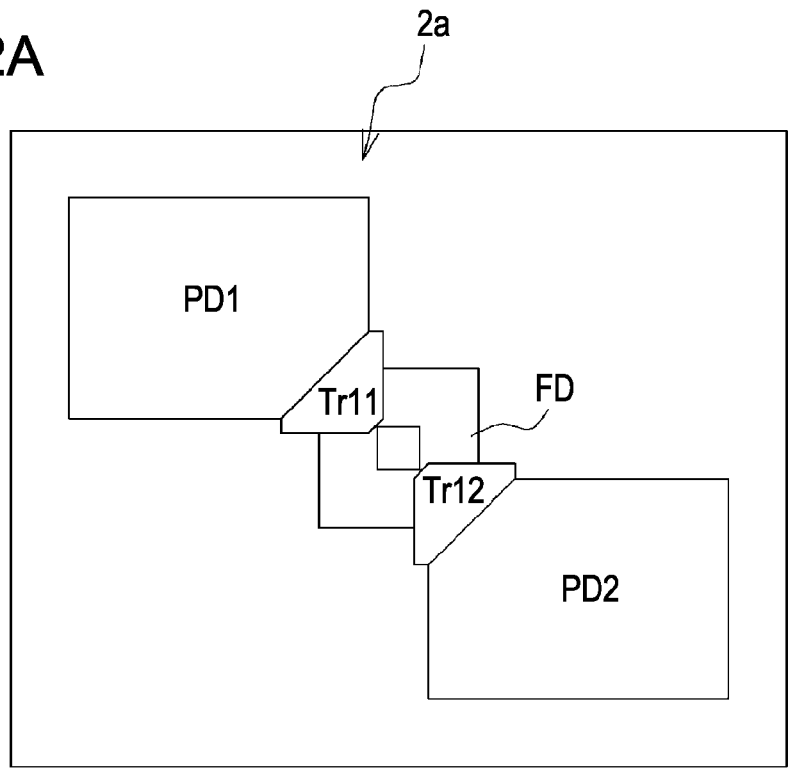
FIG. 2A is a schematic view illustrating a plane configuration of a component-shared-by-two-pixels unit that includes two pixels.

In the plane structure of one of the component-shared-by-two-pixels units 2 disposed in a matrix, one floating diffusion (FD) is disposed between two light sensing units, which are diagonally adjacent to each other. In other words, these two light sensing units share the floating diffusion (FD) through the transfer transistors Tr11 and Tr12 that are attached to the light sensing units respectively, for example, as shown in FIG. 2A. A component-shared-by-two-pixels unit shown in FIG. 2A will be referred to as a component-shared-by-two-pixels unit 2a hereinafter.

Figure 3A:
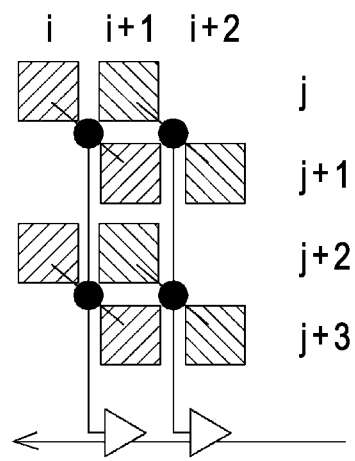
FIG. 3A is a schematic view illustrating how the component-shared-by-two-pixels unit shown in FIG. 2A shares components.

A pair of light sensing units at coordinate points (i,j) and (i+1, j+1) of a two-dimensional array composed of the component-shared-by-two-pixels units 2a shall be discussed. In this case, the pair of light sensing units at coordinate points (i,j) and (i+1, j+1) share one floating diffusion (FD) as shown in, for example, FIG. 3A. Furthermore, a pair of light sensing units at coordinate points (i,j+2) and (i+1, j+3) also share one floating diffusion (FD). Other pairs similarly share floating diffusions (FD) on a pair of light sensing units-by-floating diffusion (FD) basis.

Figure 4:
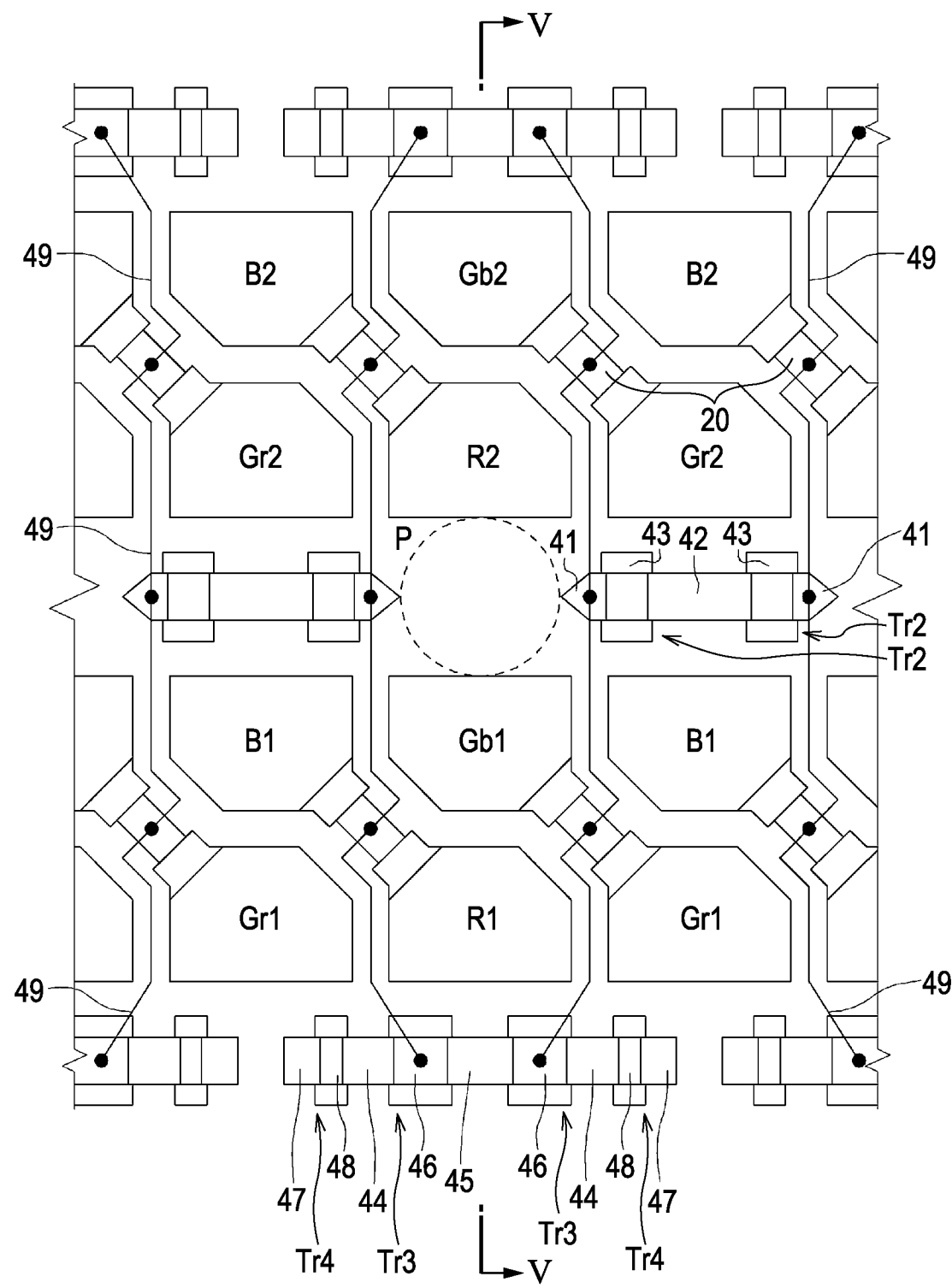
FIG. 4 is a schematic view illustrating a layout of an imaging unit.

FIG. 4 shows the layout of the imaging unit 3 including component-shared-by-two-pixels units 2a according to the first embodiment of the present invention. As shown in FIG. 4, spaces among the light sensing units where the floating diffusions (FD) are not disposed are allocated for transistor regions where transistors are disposed. A rest transistor Tr2, an amplifying transistor Tr3, and a selection transistor Tr4 are disposed in each of the transistor regions.

To put it concretely, a component-shared-by-two-pixels unit 2a belonging to (2n−1)th row has its reset transistor Tr2 on the upper side and its amplifying transistor Tr3 and selection transistor Tr4 on the lower side. A component-shared-by-two-pixels unit 2a belonging to 2 nth row has its reset transistor Tr2 on the lower side and its amplifying transistor Tr3 and selection transistor Tr4 on the upper side.

The reset transistor Tr2 is composed of a source region 41, a drain region 42, and a reset gate 43. The amplifying transistor Tr3 is composed of a source region 44, a drain region 45, and an amplifying gate 46. The selection transistor Tr4 is composed of a source region 47, a drain region 44, and a selection gate 48. Here, the source region of the amplifying transistor Tr3 is also used as the drain region of the selection transistor Tr4.

In addition, an interconnection 49 connects a floating diffusion (FD) region 20, the source region 46 of the reset transistor Tr2, and the amplifying gate 46 of the amplifying transistor Tr3. In addition, an interconnection (not shown in FIG. 4) connects the source region 47 of the selection transistor Tr4 and the vertical signal line 8.

In addition, interconnection layers 17 (not shown in FIG. 4) are formed on the transistor regions where reset transistors Tr2, amplifying transistors Tr3, and selection transistors Tr4 are disposed. The interconnection layers apply electrical signals to the gates of the above transistors.

Figure 5:
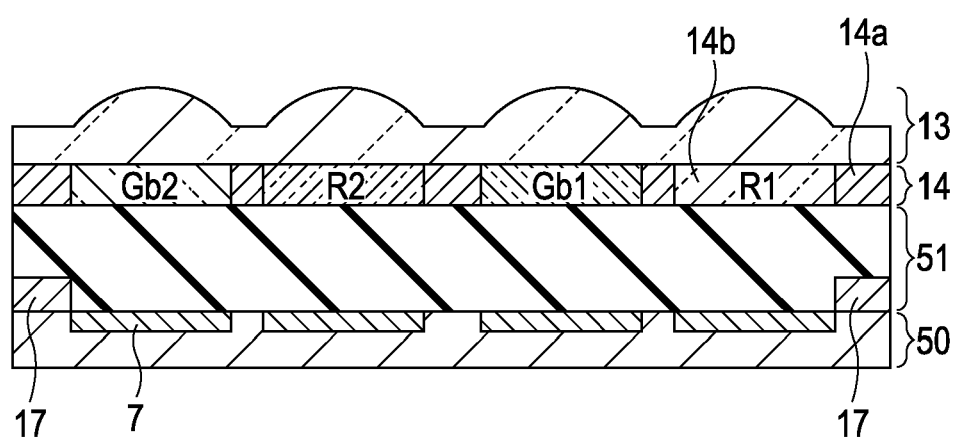
FIG. 5 is a schematic view illustrating a cross-sectional surface of an imaging unit of a CMOS-type image sensor according to a first embodiment of the present invention.

FIG. 5 is a drawing for illustrating a cross-sectional surface of an imaging unit 3 of the CMOS-type image sensor according to the first embodiment of the present invention. To be exact, FIG. 5 is a schematic cross-sectional view taken along the line V-V of FIG. 4.

As shown in FIG. 5, an insulating layer (not shown) such as a silicon oxide layer is formed on a substrate 50 including plural light sensing units 7, and in addition, a light-transmitting insulating layer 51 is formed on the insulating layer. The surface of the light-transmitting insulating layer 51 is planarized.

PSG (phosphosilicate glass) or BPSG (borophosphosilicate glass) and the like can be used as a material for the light-transmitting insulating layer 51.

In addition, an on-chip color filter 14 (OCCF) is disposed on the planarized light-transmitting insulating layer 51. The OCCF 14 shown in FIG. 5 is coded by primary colors, and light transmission regions 14b respectively separated by boundary regions 14a are colored with any of red (R), green (G), and blue (B). To put it concretely, as shown in FIG. 4, if light transmission regions belonging to a certain row of the light transmission regions 14b disposed in a two-dimensional array are colored R, G, R, G, and the like, light transmission regions belonging to a first row adjacent to the certain row are colored B, G, B, G, and the like, and light transmission regions belonging to a second row adjacent to the certain row are colored R, G, R, G, and the like. In other words, a so-called Bayer array is applied to the light transmission regions 14b disposed in a two-dimensional array.

A light sensing unit 7 with a red-colored light transmission region 14b thereover indicates that the light sensing unit 7 selectively receives red light, and a light sensing unit 7 with a green-colored light transmission region 14b thereover indicates that the light sensing unit 7 selectively receives green light. Similarly, a light sensing unit 7 with a blue-colored light transmission region 14b thereover indicates that the light sensing unit 7 selectively receives blue light.

In addition, a letter "Gr" marked in a light transmission region 14b indicates that the light transmission region 14b is a green-colored light transmission region and that red-colored light transmission regions and green colored light transmission regions are alternately disposed in a row to which the green light transmission region 14b belongs. For simplicity, the above described light transmission region 14b is denoted by "Gr". Similarly, a letter "Gb" marked in a light transmission region 14b indicates that the light transmission region 14b is a green-colored light transmission region and that blue-colored light transmission regions and green-colored light transmission regions are alternately disposed in a row to which the green light transmission region 14b belongs. For simplicity, the above described light transmission region 14b is denoted by "Gb".

In the layout of the imaging unit 3 according to the first embodiment, a component-shared-by-two-pixels unit 2a has two different types of positional relations between its two light sensing units and its transistors composed of a reset transistor Tr2, an amplifying transistor Tr3, and a selection transistor Tr4. The type that a component-shared-by-two-pixels unit 2 has is determined by the pair of rows in which the component-shared-by-two-pixels unit 2 is positioned. Therefore, for convenience of explanation, a light transmission region 14b corresponding to a light sensing unit that has its reset transistor Tr2 thereover and its amplifying transistor Tr3, and its selection transistor Tr4 therebelow is denoted by "R1", "Gr1", "Gb1", or "B1". On the other hand, a light transmission region 14b corresponding to a light sensing unit that has its reset transistor Tr2 therebelow and its amplifying transistor Tr3, and its selection transistor Tr4 thereover is represented by "R2", "Gr2", "Gb2", or "B2".

As shown in FIG. 4, the same colors (red) are delivered to both a light sensing unit corresponding to "R1" and a light sensing unit corresponding to "R2". In addition, for example, a case will be considered in which a pair of light sensing units that are respectively adjacent to the light sensing unit corresponding to "R1" and the light sensing unit corresponding to "R2", and that are at the same time located at the same position relative to the light sensing unit corresponding to "R1" and at the same position relative to the light sensing unit corresponding to "R2". In this case, there are eight pairs, and the same colors are delivered to any of these pairs. Therefore, it can be safely said that the same colors are delivered to both the light sensing units corresponding to "R1" and corresponding to "R2" in accordance with the same rule. In addition, the same colors (blue) are delivered to both the light sensing unit corresponding to "B1" and the light sensing unit corresponding to "B2". In addition, for example, a case will be considered in which a pair of light sensing units that are respectively adjacent to the light sensing units corresponding to "B1" and to "B2", and that are at the same time located at the same position relative to the light sensing unit corresponding to "B1" and at the same position relative to the light sensing unit corresponding to "B2". In this case, there are eight pairs, and the same colors are delivered to any of these pairs. Therefore, it can be safely said that the same colors are delivered to both the light sensing units corresponding to "B1" and corresponding to "B2" in accordance with the same rule. Similarly, the same can be said for a pair of a light sensing unit corresponding to "Gb1" and a light sensing unit corresponding to "Gb2" and a pair of a light sensing unit corresponding to "Gr1" and a light sensing unit corresponding to "Gr2".

On the other hand, the same colors (green) are delivered to both the light sensing unit corresponding to "Gr1" and the light sensing unit corresponding to "Gb1". However, the same colors are not delivered respectively to light sensing units adjacent to the light sensing unit corresponding to "Gr1" and light sensing units adjacent to the light sensing unit corresponding to "Gb1". Therefore, it is difficult to say that the same colors are delivered to both light sensing units corresponding to "Gr1" and corresponding to "Gb1" in accordance with the same rule. Similarly, the same can be said for a pair of light sensing units corresponding to "Gr2" and "Gb2".

On the OCCF 14 are on-chip lenses (OCLs) made of a light-transmitting material such as negative photosensitive resin disposed. Light received and collected by the lens surfaces (which are of a convex curved surface) of the OCLs 13 enters the light sensing units 7.

[Arrangement of on-Chip Lenses]

Figure 6:
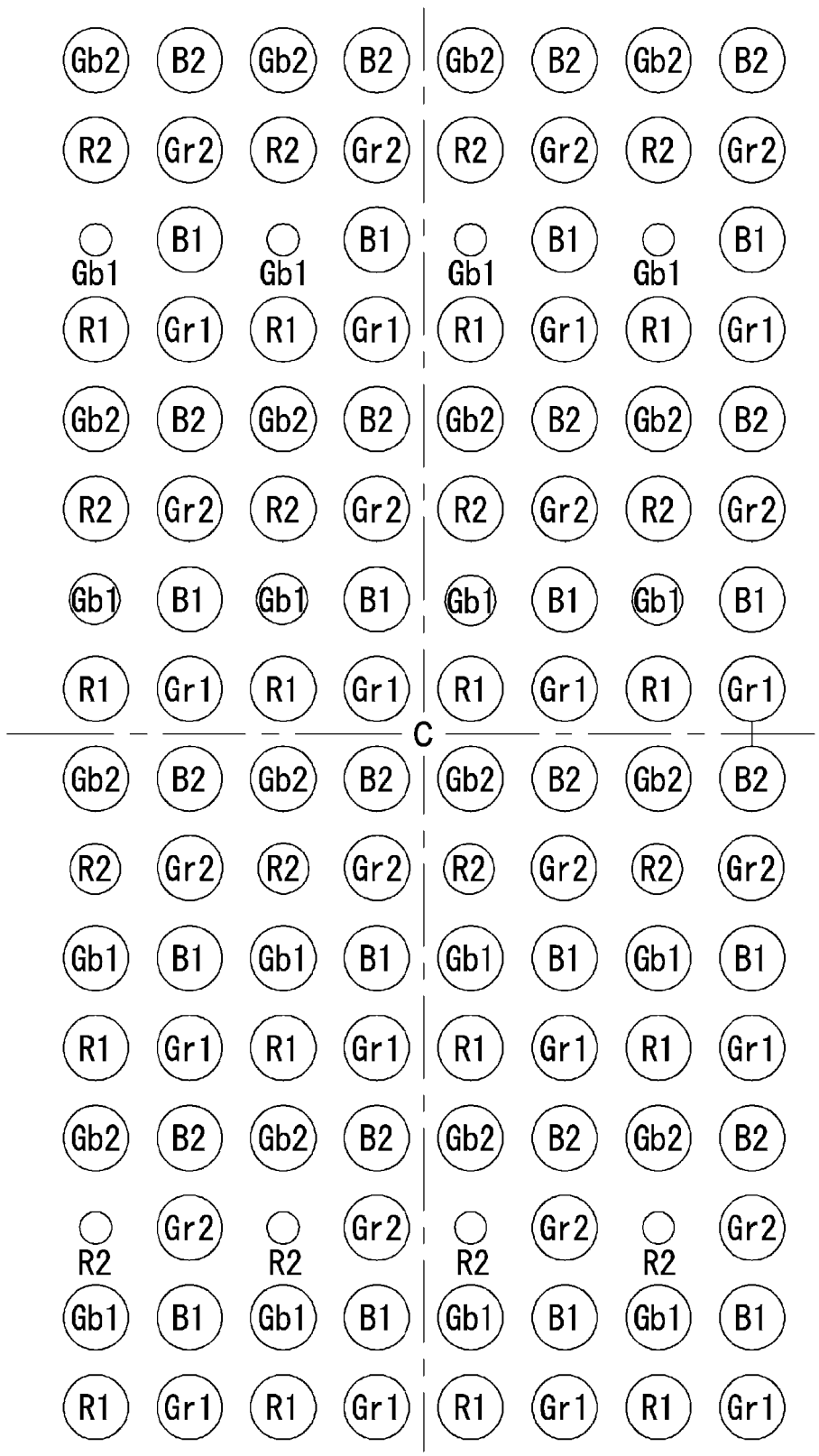
FIG. 6 is a schematic view illustrating on-chip lenses of the CMOS-type image sensor according to the first embodiment.

FIG. 6 is a schematic view illustrating the arrangement of on-chip lenses (OCLs) 13 of the CMOS-type image sensor according to the first embodiment. A symbol C in FIG. 6 indicates the center point of the imaging unit 3.

In the first embodiment, the OCLs 13 corresponding to "Gb1" in the upper half of the schematic view of the on-chip lenses in FIG. 6 are formed so as to become gradually smaller as the OCLs go along the upward direction of the schematic view. In other words, light-collection characteristics of the OCLs 13 corresponding to "Gb1" are adjusted by forming the effective areas of the OCLs 13 so as to become gradually smaller in the upward direction of the schematic view in FIG. 6.

On the other hand, the OCLs 13 corresponding to "R2" in the lower half of the schematic view of the on-chip lenses in FIG. 6 are formed so as to become gradually smaller in the downward direction of the schematic view. In other words, light-collection characteristics of the OCLs 13 corresponding to "Gb1" are adjusted by forming the effective areas of the OCLs 13 so as to become gradually smaller in the downward direction in the lower half of the schematic view in FIG. 6.

In this embodiment, adjustment of the light-collection characteristics of the OCLs 13 that is achieved by making the effective areas of the OCLs 13 gradually smaller is described as an example. However, the adjustment of the light-collection characteristics of the OCLs 13 can be achieved not only by this method, but also by other methods. For example, the adjustment of the light-collection characteristics of the OCLs 13 can be achieved by changing the curvature radii of the OCLs 13 or by growing films that have low light transmissivities on the surfaces of the OCLs 13.

In addition, in this embodiment, the adjustment of the light-collection characteristics of the OCLs 13 by making the effective areas of the OCLs 13 gradually smaller on a one-on-chip-lens by one-on-chip-lens basis in the upward direction or downward direction of the schematic view from the center of the imaging unit 3 in FIG. 6 is described as an example. Alternatively, the effective areas of the OCLs 13 can be made smaller in stages on an a-certain-number-of-on-chip-lenses by a-certain-number-of-on-chip-lenses basis or on a dozens-of-on-chip-lenses by dozens-of-on-chip-lenses basis in the upward direction or downward direction of the schematic view from the center of the imaging unit 3 in FIG. 6. If the above-described method in which the effective areas of the OCLs 13 are made smaller in stages is employed, it brings about advantageous effects in the practical design of the imaging unit 3.

[Adjustment of Differences Among Sensitivities with Use of on-Chip Lenses]

As described above, periodic differences among the sensitivities of the on-chip lenses owing to the irregularity of positional relations between the light sensing units 7 and the interconnection layers 17 and the non-uniformity of pixel patterns can be reduced by adjusting the sizes of the OCLs 13. Explanations about the above adjustment will be described in detail below.

Figure 7:
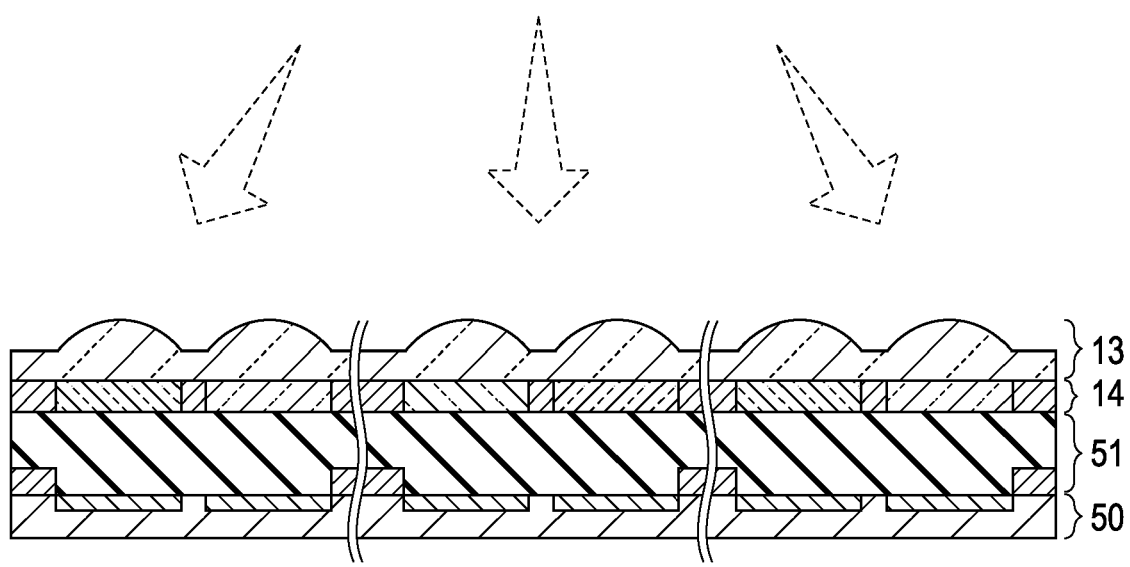
FIG. 7 is a schematic view illustrating a cross-sectional view taken along the line VII-VII in FIG. 1.

Firstly, the imaging unit 3 of the CMOS-type image sensor is configured so that a light beam enters the center of the imaging unit 3 at right angles, but a light beam inevitably enters the peripheral region of the imaging unit 3 with a certain angle. To put it concretely, as shown in FIG. 7, which is a schematic view illustrating a cross-sectional view taken along the line VII-VII in FIG. 1, a light beam enters the upper region of the imaging unit 3 at an upward angle, and a light beam enters the lower region of the imaging unit 3 at a downward angle.

In addition, as is clear from FIG. 4, in the layout of the imaging unit 3 including component-shared-by-two-pixels units 2a according to the first embodiment of the present invention, no transistor is disposed in the space between the light sensing unit corresponding to "R2" and the light sensing unit corresponding to "Gb1". Because no transistor is disposed in this region, no interconnection layer 17 is also disposed in this region. Therefore, incident light is not prevented from entering by any interconnection layer, so the photoelectric conversion regions of the light sensing units corresponding to "R2" and "Gb1" are effectively enlarged thanks to the space (region represented by P in FIG. 4), with the result that the output sensitivities of the light sensing units corresponding to "R2" and "Gb1" are increased.

In other words, in the positional relation between the light-entering units and the interconnection layers shown in FIG. 4, spaces (regions represented by P in FIG. 4) are formed among the component-shared-by-two pixels units 2a periodically in the vertical direction in FIG. 4. Therefore, regions that contribute to the effective enlargement of the photoelectric conversion regions and the increase of the output sensitivities appear periodically in the vertical direction.

In addition, when light beams enter the upper region of the imaging unit 3 at upward angles, the output sensitivities of the light sensing units corresponding to "Gb1" are readily affected and increased. On the other hand, when light beams enter the lower region of the imaging unit 3 at downward angles, the output sensitivities of the light sensing units corresponding to "R2" are readily affected and increased.

In other words, because the angle of an incident light that enters the upper region of the imaging unit 3 and the angle of an incident light that enters the lower region of the imaging unit 3 are different, light sensing units whose output sensitivities are readily affected and increased in the upper region of the imaging unit 3 are different from light sensing units whose output sensitivities are readily affected and increased in the lower region of the imaging unit 3. Therefore, the color delivered to the light sensing units that are readily affected in the upper region of the imaging unit 3 ("Gb1" in the case of the first embodiment) is different from the color delivered to the light sensing units that are readily affected in the lower region of the imaging unit 3 ("R2" in the case of the first embodiment).

As described above, the light sensing units corresponding to "Gb1" are more readily affected and their sensitivities are more increased by the upward lights in the upper region of the imaging unit 3 than the light sensing units corresponding to "Gb2". On the other hand, the light sensing units corresponding to "R2" are more readily affected and their sensitivities are more increased by the downward lights in the lower region of the imaging unit 3 than the light sensing units corresponding to "R1". In addition, because the angle of gradient of the incident light gets large in proportion to the distance along a vertical direction (along an upward direction or a downward direction) from the center of the imaging unit 3, the influence by the angle of gradient of the incident light to the light sensing units gets large in proportion to the distance along a vertical direction (along an upward direction or a downward direction) from the center of the imaging unit 3.

Figure 13:
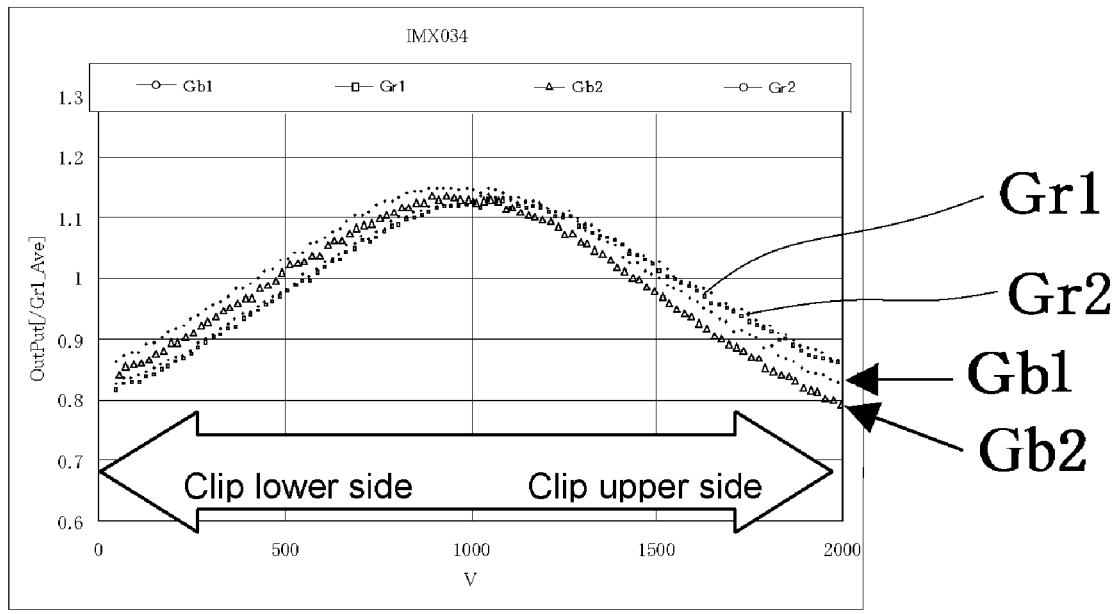
FIG. 13 is a graph of light sensing unit output signal values under a first set of conditions.

Values of output signals of light sensing units corresponding to "Gb1", "Gb2", "Gr1", and "Gr2" are shown in a graph in FIG. 13 under the condition that OCLs 13 for "Gb1", "Gb2", "Gr1", and "Gr2" are of the same size, and predefined incident lights enter the OCLs 13 for "Gb1", "Gb2", "Gr1", and "Gr2".

As is clear from FIG. 13, in the upper region of the imaging unit 3, the output sensitivities of the light-entering unit corresponding to "Gb1" is higher than those of the light-entering unit corresponding to "Gb2". In addition, the differences between the output sensitivities of the light-entering unit corresponding to "Gb1" and those of the light-entering unit corresponding to "Gb2" get large in proportion to the distance along a vertical direction (along an upward direction) from the center of the imaging unit 3.

Figure 14:
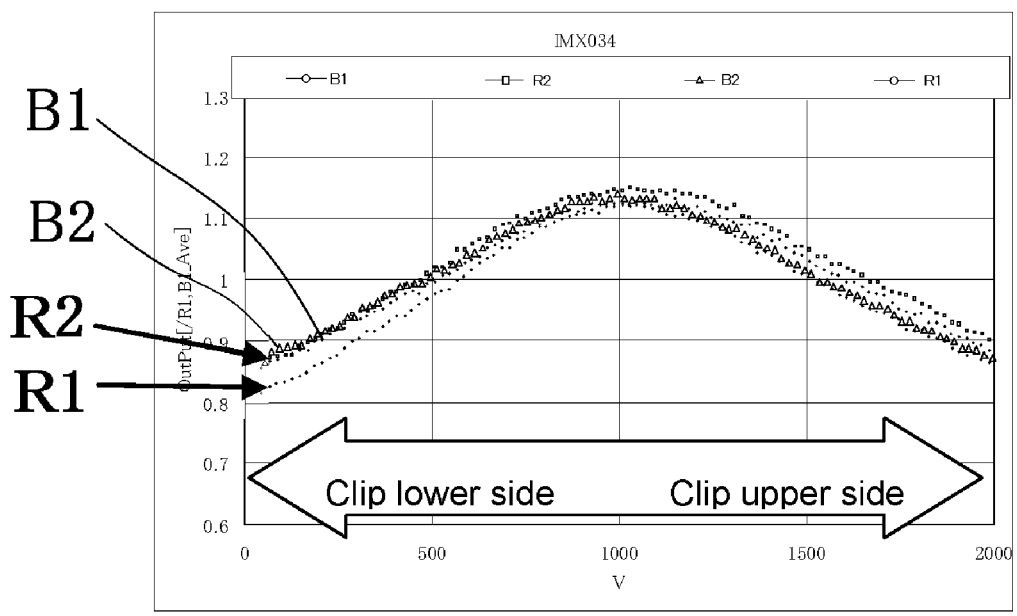
FIG. 14 is a graph of light sensing unit output signal values under a second set of conditions

Values of output signals of light sensing units corresponding to "R1", "R2", "B1", and "B2" are shown in a graph in FIG. 14 under the condition that OCLs 13 for "R1", "R2", "B1", and "B2" are of the same size, and the predefined incident lights enter the OCLs 13 for "R1", "R2", "B1", and "B2".

As is clear from FIG. 14, in the lower region of the imaging unit 3, the output sensitivities of the light-entering unit corresponding to "R2" is higher than those of the light-entering unit corresponding to "R1". In addition, the differences between the output sensitivities of the light-entering unit corresponding to "R2" and those of the light-entering unit corresponding to "R1" get large in proportion to the distance along a vertical direction (along a downward direction) from the center of the imaging unit 3.

As described above, owing to the fact that the regions that contribute to the increase of the output sensitivities appear periodically in the vertical direction, the degradation of images that linear defects are generated in the vertical direction periodically is induced.

In order to suppress such degradation of images, OCLs 13 corresponding to "Gb1" on the upper half of the imaging unit 3 are formed so that they become gradually smaller as they go along the upward direction of the schematic view in FIG. 6, which leads to the reduction of the differences of sensitivities among the light sensing units on the upper half of the imaging unit 3.

In other words, the degradation of images is induced owing to the fact that the output sensitivities of the light sensing units corresponding to "Gb1" on the upper half of the imaging unit 3 are higher than those of the light sensing units corresponding to "Gb2". Therefore, in order to reduce such differences of the output sensitivities, the light-collection characteristics of the OCLs 13 corresponding to "Gb1" are adjusted.

Similarly, it is possible to reduce the differences of sensitivities among the light sensing units on the lower half of the imaging unit 3 by forming OCLs 13 corresponding to "R2" on the lower half of the imaging unit 3 so that they become gradually smaller as they go along the downward direction of the schematic view in FIG. 6.

In other words, the degradation of images is induced owing to the fact that the output sensitivities of the light sensing units corresponding to "R2" on the lower half of the imaging unit 3 are higher than those of the light sensing units corresponding to "R1". Therefore, in order to reduce such differences of the output sensitivities, the light-collection characteristics of the OCLs 13 corresponding to "R2" are adjusted.

Figure 15:
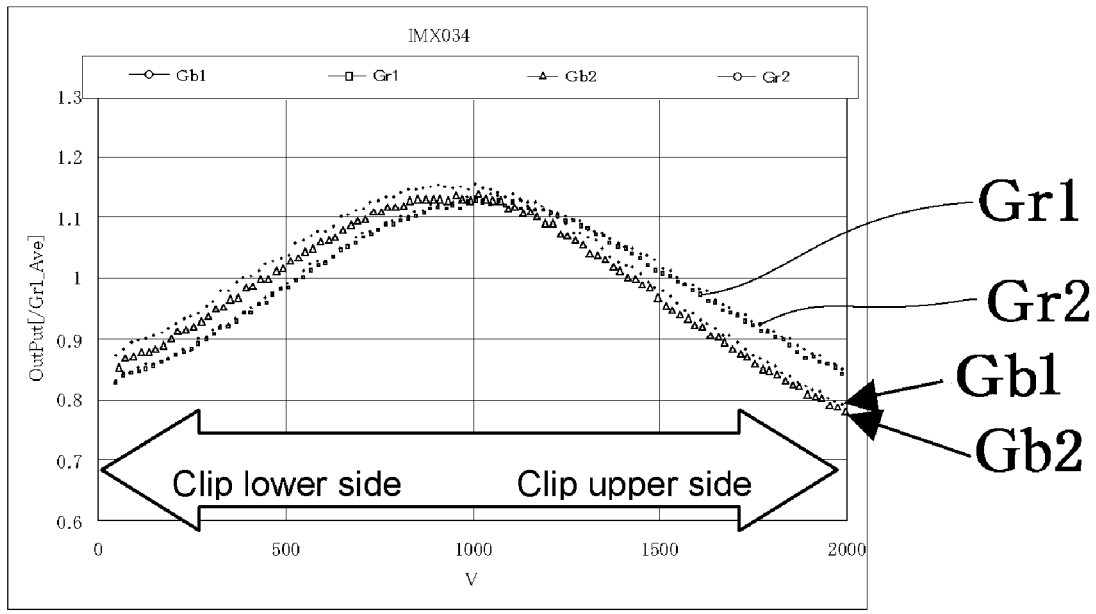
FIG. 15 is a graph of light sensing unit output signal values for a first reduction ratio for Gb1.
Figure 16:
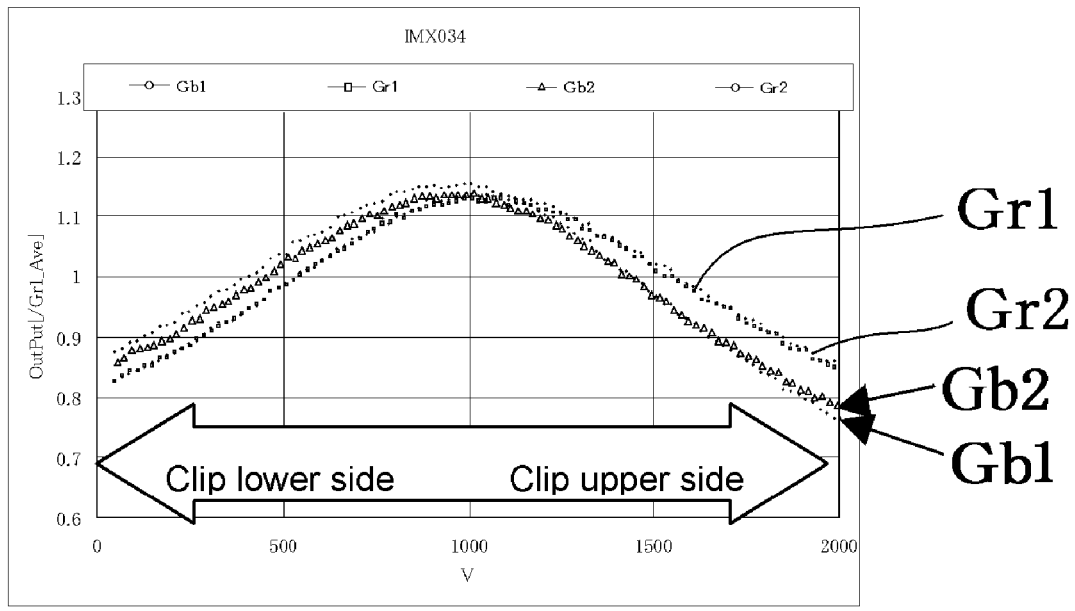
FIG. 16 is a graph of light sensing unit output signal values for a second reduction ratio for Gb1.
Figure 17:
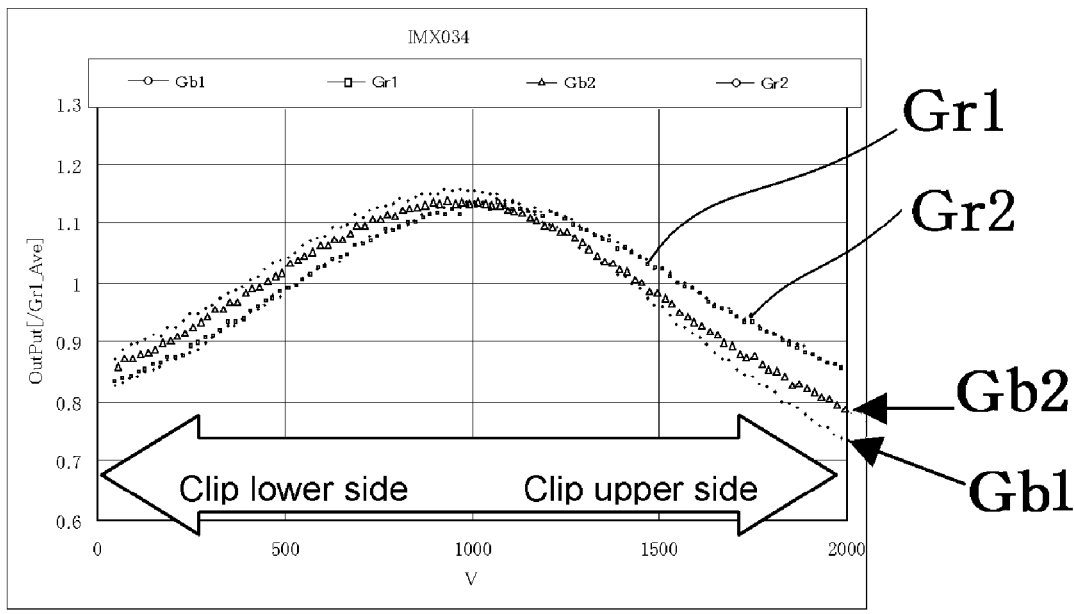
FIG. 17 is a graph of light sensing unit output signal values for a third reduction ratio for Gb1.

In the CMOS-type image sensor according to the first embodiment, values of output signals of light sensing units corresponding to "Gb1", "Gb2", "Gr1", and "Gr2" for three reduction ratios of "Gb1" are shown in graphs in FIG. 15, FIG. 16 and FIG. 17 under the condition that OCLs 13 for "Gb1", "Gb2", "Gr1", and "Gr2" are of the same size, and the predefined incident lights enter the OCLs 13 for "Gb1", "Gb2", "Gr1", and "Gr2". The reduction ratios of "Gb1" for FIG. 15, FIG. 16 and FIG. 17 are defined to become larger in ascending order.

As is clear from FIG. 15 and FIG. 16, by adjusting the sizes of OCLs 13 for "Gb1", the output sensitivities of the light sensing units corresponding to "Gb1" on the upper half of the imaging unit 3 are reduced, and the differences between light sensing units corresponding to "Gb1" and "Gb2" are narrowed. FIG. 17 shows the case where the reduction ratio is so large that the adjustment is excessive.

Figure 18:
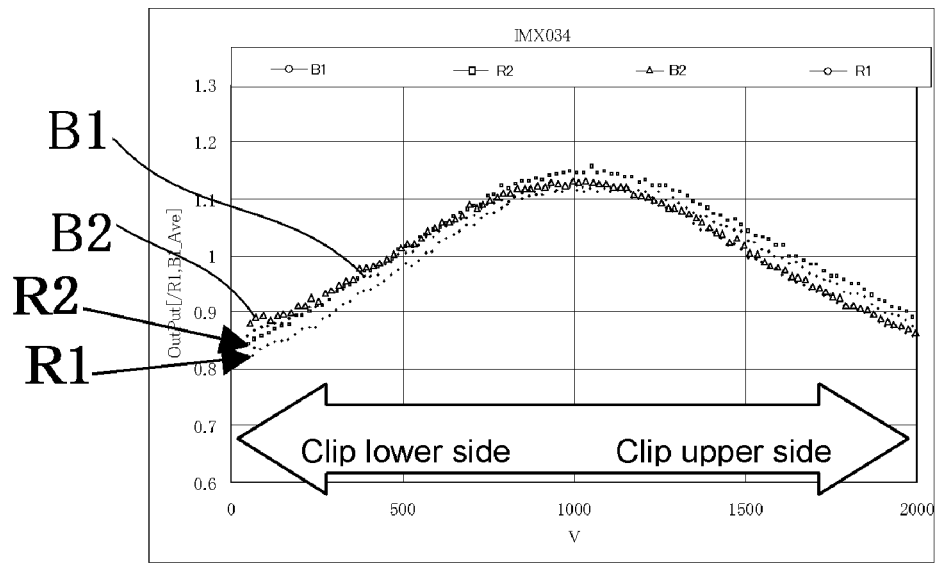
FIG. 18 is a graph of light sensing unit output signal values under a fourth set of conditions.
Figure 19:
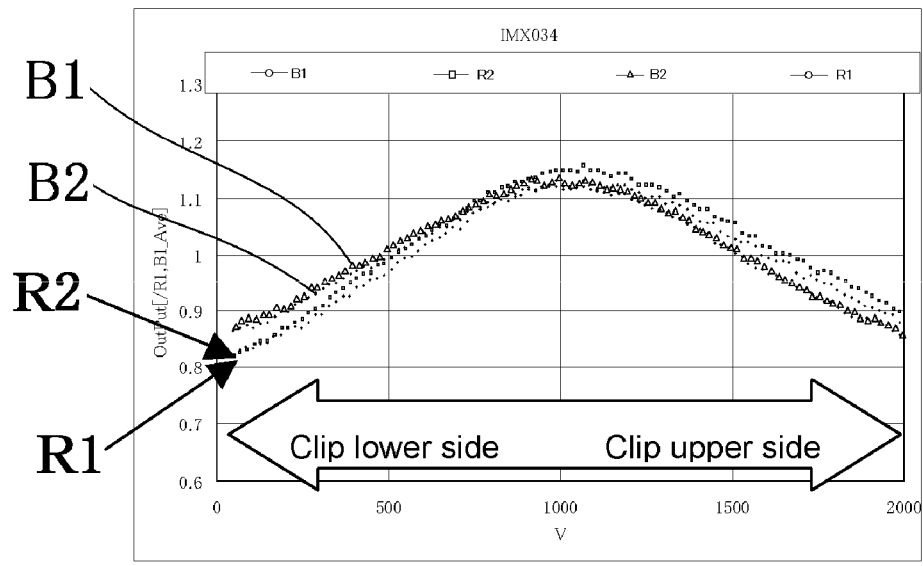
FIG. 19 is a graph of light sensing unit output signal values under a fifth set of conditions.
Figure 20:
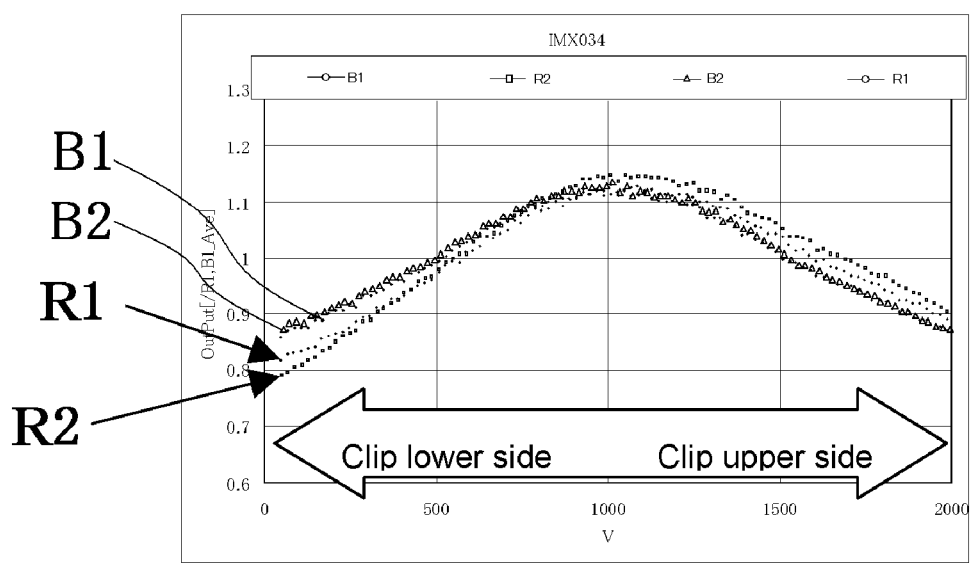
FIG. 20 is a graph of light sensing unit output signal values for a six set of conditions.

In the CMOS-type image sensor according to the first embodiment, values of output signals of light sensing units corresponding to "R1", "R2", "B1", and "B2" for three reduction ratios of "R2" are shown in graphs in FIG. 18, FIG. 19 and FIG. 20 under the condition that OCLs 13 for "R1", "R2", "B1", and "B2" are of the same size, and the predefined incident lights enter the OCLs 13 for "R1", "R2", "B1", and "B2". The reduction ratios of "R2" for FIG. 18, FIG. 19 and FIG. 20 are defined to become larger in ascending order.

As is clear from FIG. 18 and FIG. 19, by adjusting the sizes of OCLs for "R2", the output sensitivities of the light sensing units corresponding to "R2" on the lower half of the imaging unit 3 are reduced, and the differences between light sensing units corresponding to "R1" and "R2" are narrowed. FIG. 20 shows the case where the reduction ratio is so large that the adjustment is excessive.

According to the embodiment, as described above, by adjusting the sizes of OCLs 13, the differences between light sensing units corresponding to "Gb1" and "Gb2" on the upper half of the imaging unit 3 are narrowed as well as the differences between light sensing units corresponding to "R1" and "R2" on the lower half of the imaging unit 3 are narrowed.

The differences among sensitivities of the light sensing units owing to the non-uniformity of pixel patterns, and concretely owing to the fact that photoelectric conversion regions of the light sensing units are effectively enlarged thank to the region represented by P in FIG. 4, can be reduced. By reducing the differences among the sensitivities of the light sensing units, uniform pixel output signals can be provided, and the deterioration of image quality that is generated periodically can be suppressed.

In addition, according to this embodiment, because one floating diffusion (FD) is disposed between a pair of the light sensing units 7 adjacent to each other on a slant, the miniaturization of the size of the imaging unit 3 can be realized without lowering the sensitivities of the light sensing units 7.

Therefore, according to this embodiment, the miniaturization of the imaging unit 3 can be realized by employing a so-called component-shared-by-plural-pixels structure and the differences of the sensitivities generated periodically among the light sensing units can be reduced as well, with the result that both the miniaturization and the suppression of the deterioration of the image quality of the CMOS-type image sensor can be realized.

2. A Second Embodiment

[A Configuration of a Camera]

Figure 12:
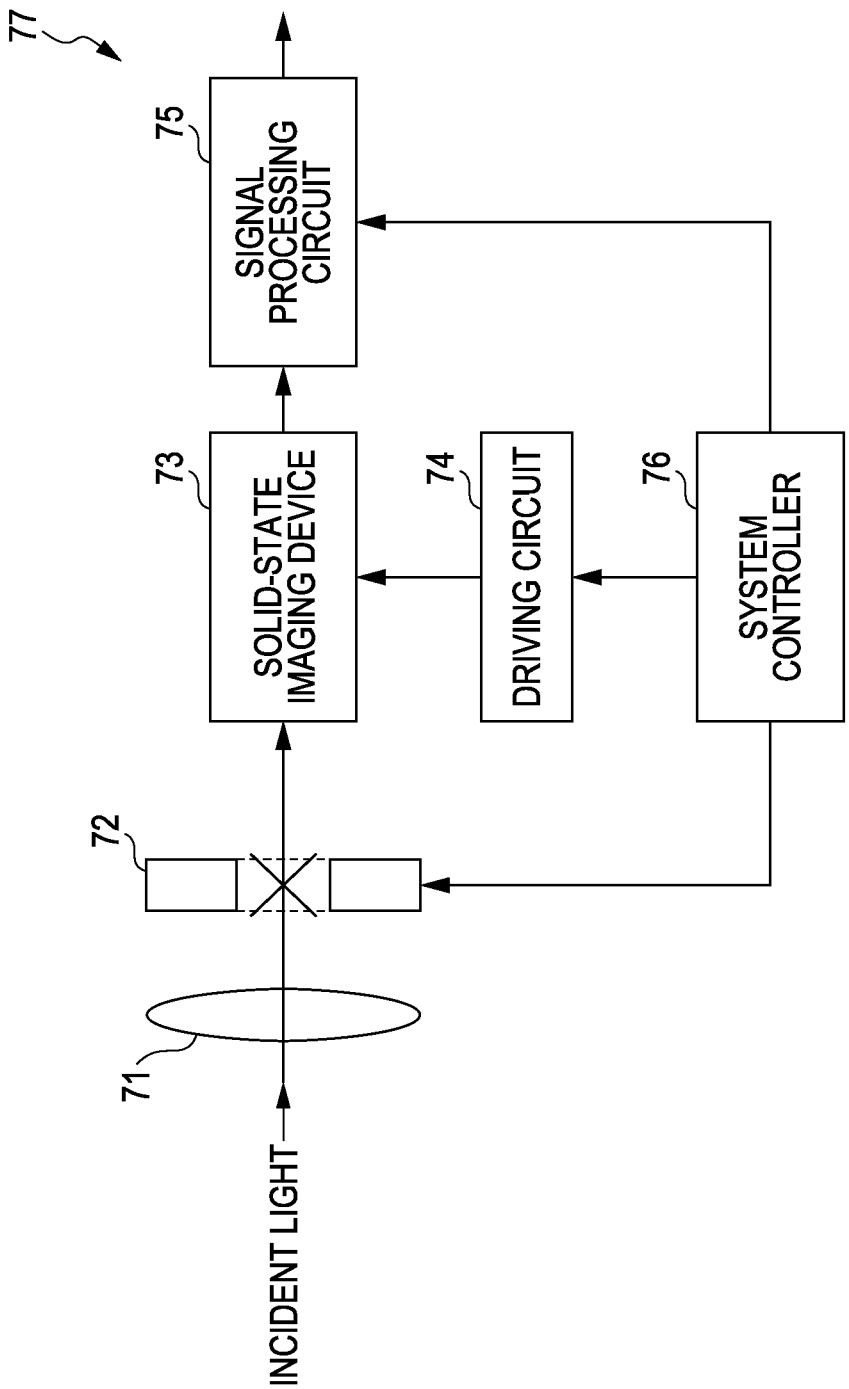
FIG. 12 is a schematic configuration diagram of an example of a CMOS-type camera according to another embodiment of the present invention.

FIG. 12 is a schematic configuration diagram of an example of a CMOS-type camera according to another embodiment of the present invention is employed. The above-described CMOS-type image sensor according to the first embodiment is employed as an imaging device in this camera 77.

The camera 77 according to this embodiment of the present invention is configured so that incident lights from an object (not shown in FIG. 12) enter an imaging unit of a solid-state imaging device 73 through an optical system such as a lens 71 and a mechanical shutter 72. The mechanical shutter 72 is used for setting the exposure time by conducting or shutting out the incident lights to/from the imaging unit of the solid-state imaging device 73.

In this camera, the above-described solid-state imaging device according to the first embodiment is used as the solid-state imaging device 73, and this solid-state imaging device 73 is driven by a driving circuit 74 having a timing generator circuit, a driving system, and the like.

Various types of signal processing are performed on output signals from the solid-state imaging device 73 by a signal processing circuit 75, and then processed signals are output as image signals, and recorded in recording media such as memories, or output for monitoring.

The opening and closing control of the mechanical shutter 72, the control of the driving circuit 74, and the control of the signal processing circuit 75 are performed by a system controller 76.

Because the solid-state imaging device according to this embodiment of the present invention is employed in this camera, the differences among sensitivities of light-entering units owing to the non-uniformity of pixel patterns can be reduced, with the result that the high quality of images can be obtained through the uniformity of image output signals.

3. Modifications

[Modifications about Component-Shared-by-Plural-Pixels Structure]

Figure 2B:
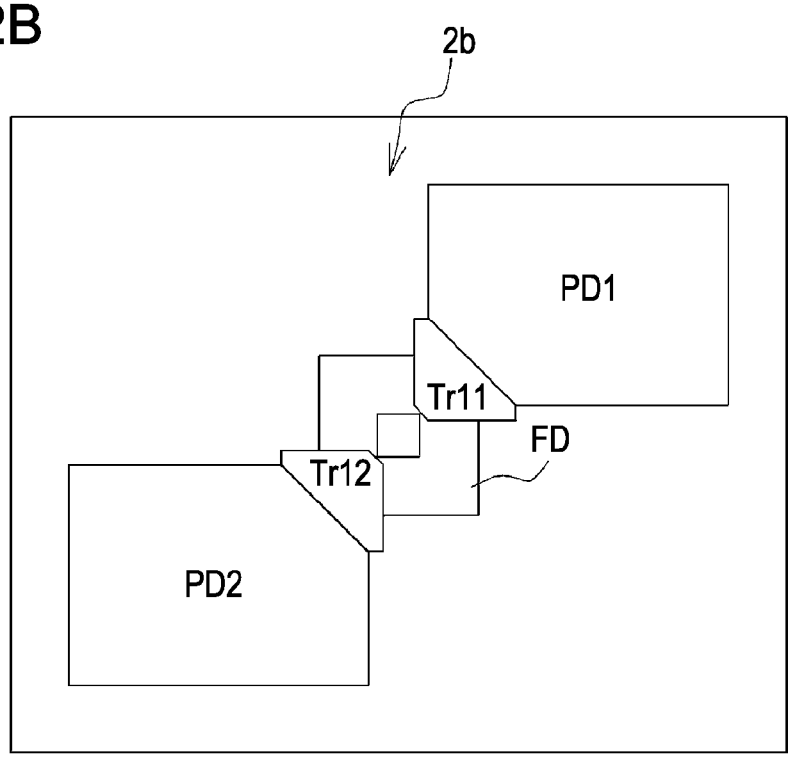
FIG. 2B is a schematic view illustrating a plane configuration of another component-shared-by-two-pixels unit that includes two pixels.

In the component-shared-by-two-pixels unit 2a according to the first embodiment, as described above, two pixels share one floating diffusion (FD) in the form shown in FIG. 2A. However, the component-shared-by-two-pixels structure is not limited to the form shown in FIG. 2A. For example, two pixels can share one floating diffusion (FD) in the form shown in FIG. 2B. Here, a component-shared-by-two-pixels unit having the structure shown in FIG. 2B will be referred to as a component-shared-by-two-pixels unit 2b hereinafter.

Figure 3B:
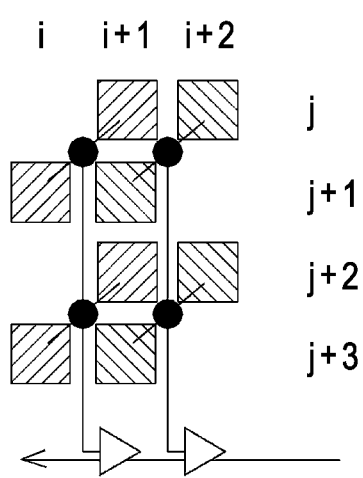
FIG. 3B is a schematic view illustrating how the component-shared-by-two-pixels unit shown in FIG. 2B shares components.

FIG. 3B shows that a pair of light sensing units at coordinate points (i+1,j) and (i, j+1) of a two-dimensional array composed of the component-shared-by-two-pixels units 2b share one floating diffusion (FD). Furthermore, a pair of light sensing units at coordinate points (i+1,j+2) and (i, j+3) also share one floating diffusion (FD) (See FIG. 3B).

Figure 8:
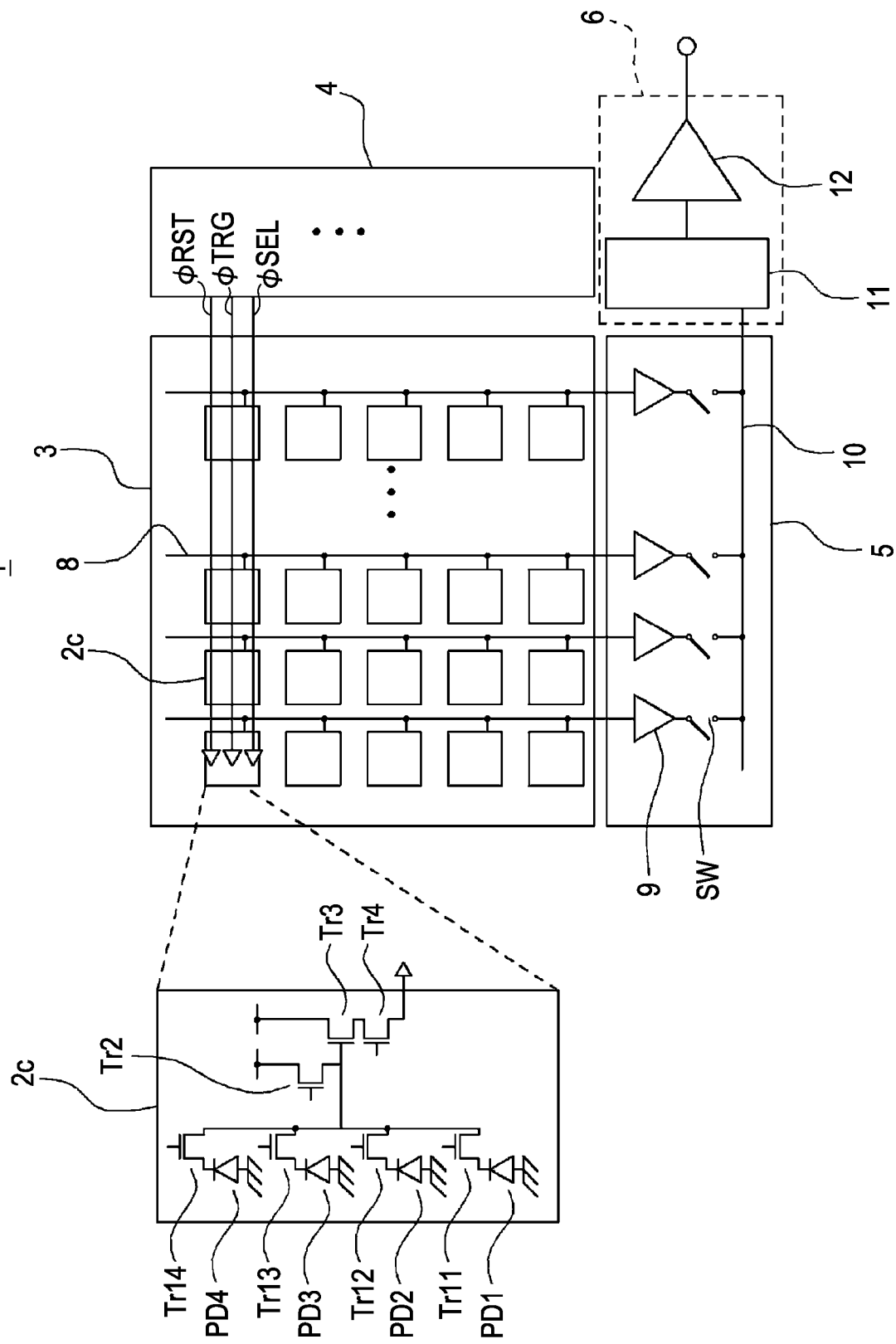
FIG. 8 is a diagram showing a schematic configuration diagram of a CMOS-type image sensor composed of component-shared-by-four-pixels units each of which includes four pixels.
Figure 9:
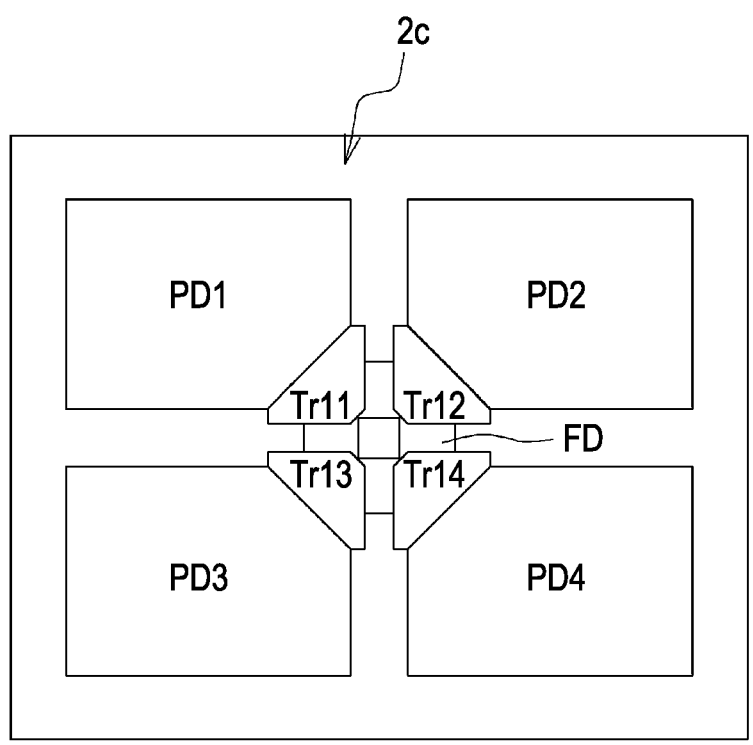
FIG. 9 is a schematic view illustrating a plane configuration of a component-shared-by-four-pixels unit that includes four pixels.

In the first embodiment, although the case where two pixels share a reset transistor Tr2, an amplifying transistor Tr3, and a selection transistor Tr4 has been described, another case where more than two pixels share transistors is conceivable. For example, a component-shared-by-four-pixels unit 2c in which four pixels share a reset transistor Tr2, an amplifying transistor Tr3, and a selection transistor Tr4 is conceivable as shown in FIG. 9. In addition, as shown in FIG. 8, a CMOS-type image sensor can be composed of the component-shared-by-four-pixels units 2c arranged in an array.

In this case, four photodiodes PD1 to PD4, each of which constitutes part of a light-entering unit, and four transmission transistors Tr11 to Tr 14 respectively corresponding to the four photodiodes PD1 to PD4 share a reset transistor Tr2, an amplifying transistor Tr3, and a selection transistor Tr4.

Figure 10:
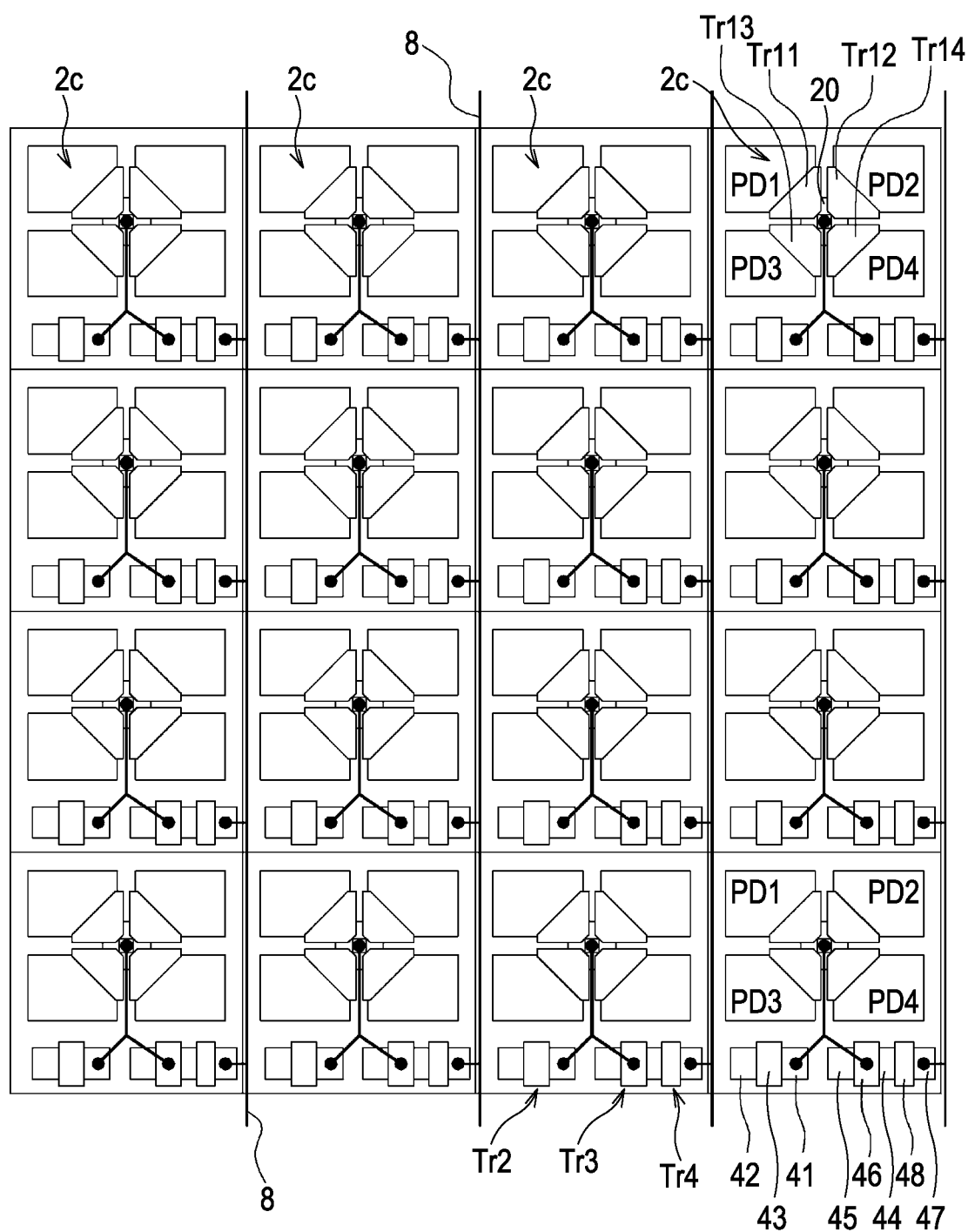
FIG. 10 is a schematic view (1) illustrating a layout of an imaging unit composed of component-shared-by-four-pixels units each of which includes four pixels.

FIG. 10 illustrates an example of a square array-shaped layout of an imaging unit 3 composed of component-shared-by-four-pixels units 2c each of which includes four pixels. In FIG. 10, each component-shared-by-four-pixels 2c unit has the reset transistor Tr2, the amplifying transistor Tr3, and the selection transistor Tr4 on its lower side.

Figure 11:
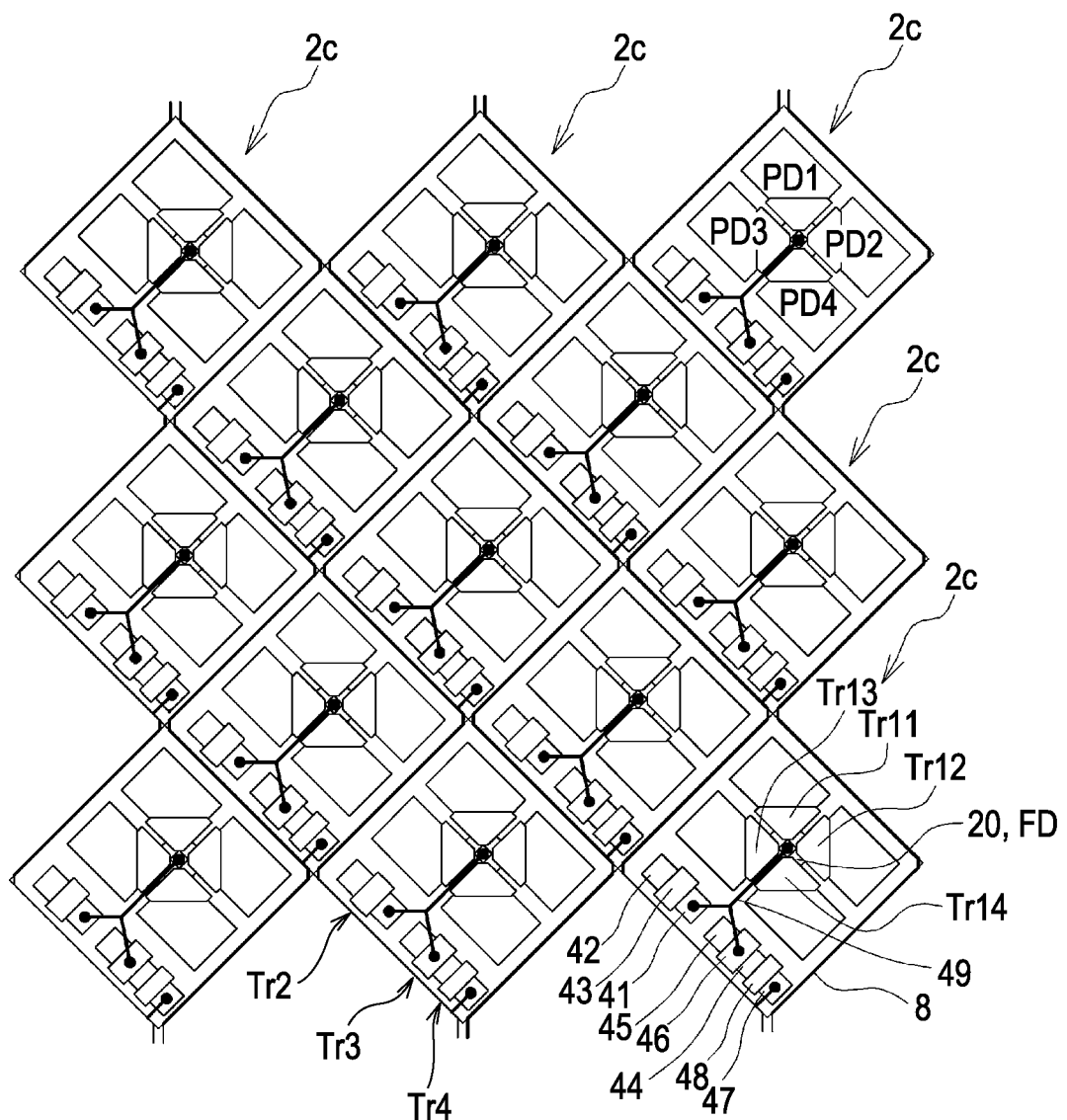
FIG. 11 is a schematic view (2) illustrating another layout of an imaging unit composed of component-shared-by-four-pixels units each of which includes four pixels.

As a layout of an imaging unit 3 composed of component-shared-by-four-pixels units 2c, not only the square array-shaped layout shown in FIG. 10, but also an oblique array (honeycomb array)-shaped layout shown in FIG. 11 can be adopted.

[Modifications of the Direction in which Light-Collection Characteristics of OCLs are Adjusted]

In the above described first embodiment, the CMOS-type image sensor has been described under the assumption that the region represented by P in FIG. 4 that causes photoelectric conversion regions to be effectively enlarged is generated periodically in the vertical direction. In other words, in the first embodiment, the CMOS-type image sensor has been described under the assumption that the positional relations between light sensing units and interconnection layers that connect the gates of transistors vary periodically in the vertical direction. Therefore, the uniformity of the image output signals is achieved by adjusting the light-collection characteristics of the OCLs 13 periodically in the vertical direction.

However, the positional relations between light sensing units and interconnection layers that connect the gates of transistors vary not only periodically in the vertical direction but also vary periodically in another direction. For example, if the positional relations between light sensing units and interconnection layers that connect the gates of transistors vary periodically in the horizontal direction, the uniformity of the image output signals is achieved by adjusting the light-collection characteristics of the OCLs 13 periodically in the horizontal direction.

In addition, if the positional relations between light sensing units and interconnection layers that connect the gates of transistors vary periodically both in the vertical direction and in the horizontal direction, the uniformity of the image output signals is achieved by adjusting the light-collection characteristics of the OCLs 13 periodically both in the vertical direction and in the horizontal direction.

[Modifications of on-Chip Color Filters]

In the above described first embodiment, the on-chip color filter 14 based on a Bayer array has been described as an example. However, the on-chip color filter 14 is not limited to one based on a Bayer array, and may be one based on another type of array as long as they can deliver colors in accordance with a predefined rule.

In addition, in the above described first embodiment, because the light sensing units corresponding "R2" and "Gb1" are respectively located over and under the region represented by P in FIG. 4, the adjustment of the light-collection characteristics of the OCLs 13 corresponding to "R2" and "Gb1" has been described as an example. However, the light sensing units respectively located over and under the region represented by P in FIG. 4 are not limited to the light sensing units corresponding to "R2" and "Gb1".

In other words, the uniformity of the image output signals is achieved by adjusting the light-collection characteristics of the OCLs 13 corresponding to the light sensing units respectively located over and under the region represented by P in FIG. 4. Therefore, what kinds of colors are delivered to the light sensing units respectively located over and under the region represented by P by the on-chip color filter does not directly relate to the adjustment of the light-collection characteristics of the OCLs 13.

The present application contains subject matter related to that disclosed in Japanese Priority Patent Application JP 2009-171674 filed in the Japan Patent Office on Jul. 23, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    an imaging unit in which a plurality of light sensing units are formed in a matrix and a plurality of interconnections are formed among the plurality of light sensing units;
    a color filter that is disposed above the imaging unit, and delivers colors to the light sensing units in accordance with a color coding scheme; and
    on-chip lenses that are disposed so as to correspond to the light sensing units on a one-to-one basis above the color filter, and have light-collection characteristics that vary in accordance with differences among sensitivities of the light sensing units, wherein,
the differences among the sensitivities of the light sensing units occur where the same colors are delivered to the light sensing units in accordance with a same rule, owing to the fact that positions of the individual interconnections relative to the light sensing units vary periodically,
a portion of the solid-state imaging device is provided with on-chip lenses that have light-collection characteristics such that light collection of light sensing units of the same rule within the portion is greater near a center line of the solid-state imaging device than light sensing units of the same rule that are within the portion and farther away from the center line, and
the light-collection characteristics render the light sensitivities of the light sensing units of the same rule more uniform.

2. The solid-state imaging device according to claim 1, wherein:
the positions of the individual interconnections relative to the light sensing units vary periodically in a vertical direction;
the light-collection characteristics of the on-chip lenses are adjusted in accordance with distances in the vertical direction from the center of the imaging unit; and
colors delivered to the light sensing units corresponding to the on-chip lenses whose light-collection characteristics are adjusted in accordance with distances in one vertical direction from the center of the imaging unit and colors delivered to the light sensing units corresponding to the on-chip lenses whose light-collection characteristics are adjusted in accordance with distances in the other vertical direction from the center of the imaging unit are different.

3. The solid-state imaging device according to claim 1, wherein:
the positions of the individual interconnections relative to the light sensing units vary periodically in a horizontal direction;
the light-collection characteristics of the on-chip lenses are adjusted in accordance with distances in the horizontal direction from the center of the imaging unit; and
colors delivered to the light sensing units corresponding to the on-chip lenses whose light-collection characteristics are adjusted in accordance with distances in one horizontal direction from the center of the imaging unit and colors delivered to the light sensing units corresponding to the on-chip lenses whose light-collection characteristics are adjusted in accordance with distances in the other horizontal direction from the center of the imaging unit are different.

4. The solid-state imaging device according to claim 1, wherein
the positions of the individual interconnections relative to the light sensing units vary periodically both in a vertical direction and in a horizontal direction respectively, and
the light-collection characteristics of the on-chip lenses are adjusted in accordance with distances both in the vertical direction and in the horizontal direction from the center of the imaging unit.

5. The solid-state imaging device according to any of claims 2, 3, and 4, wherein the light-collection characteristics of the on-chip lenses are gradually adjusted.

6. The solid-state imaging device according to any of claims 2, 3, and 4, wherein the light-collection characteristics of the on-chip lenses are adjusted in stages.

7. The solid-state imaging device according to any of claims 1, 2, 3, and 4, further comprising a plurality of charge-voltage conversion units that convert charges generated by the light sensing units into voltages, each of the plurality of charge-voltage conversion units being shared by the plurality of light sensing units.

8. A camera comprising:
a solid-state imaging device that includes an imaging unit in which a plurality of light sensing units are formed in a matrix and a plurality of interconnections are formed among the plurality of light sensing units,
a color filter that is disposed above the imaging unit, and delivers colors to the light sensing units in accordance with a color coding scheme, and
on-chip lenses that are disposed so as to correspond to the light sensing units on a one-to-one basis above the color filter, and have light-collection characteristics varying in accordance with differences among sensitivities of the light sensing units, wherein (a) the differences among the sensitivities of the light sensing units occur where the same colors are delivered to the light sensing units in accordance with a same rule, owing to the fact that positions of the individual interconnections relative to the light sensing units vary periodically; (b) a portion of the solid-state imaging device is provided with on-chip lenses that have light-collection characteristics such that light collection of light sensing units of the same rule within the portion is greater near a center line of the solid-state imaging device than light sensing units of the same rule that are within the portion and farther away from the center line, and (c) the light-collection characteristics render the light sensitivities of the light sensing units of the same rule more uniform;
an optical system that leads incident light to the imaging units; and
a signal processing circuit for processing signals output from the solid-state imaging device.

\* \* \* \* \*